(12) United States Patent
Yajima et al.

(10) Patent No.: US 9,825,206 B2
(45) Date of Patent: Nov. 21, 2017

(54) LIGHT-EMITTING DEVICE

(71) Applicant: TOYODA GOSEI CO., LTD., Kiyosu-shi (JP)

(72) Inventors: Takayoshi Yajima, Kiyosu (JP); Hiroshi Ito, Kiyosu (JP)

(73) Assignee: TOYODA GOSEI, CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/433,896

(22) Filed: Feb. 15, 2017

(65) Prior Publication Data

US 2017/0250319 A1 Aug. 31, 2017

(30) Foreign Application Priority Data

Feb. 25, 2016 (JP) .................. 2016-034878
Mar. 28, 2016 (JP) .................. 2016-064427

(51) Int. Cl.
| | | |
|---|---|---|
| *H01L 33/50* | (2010.01) | |
| *H01L 33/54* | (2010.01) | |
| *H01L 33/56* | (2010.01) | |
| *H01L 25/075* | (2006.01) | |
| *H04B 10/50* | (2013.01) | |
| *H04B 10/116* | (2013.01) | |

(52) U.S. Cl.
CPC ........ *H01L 33/502* (2013.01); *H01L 25/0753* (2013.01); *H01L 33/50* (2013.01); *H01L 33/504* (2013.01); *H01L 33/54* (2013.01); *H01L 33/56* (2013.01); *H04B 10/116* (2013.01); *H04B 10/502* (2013.01); *H01L 2251/5376* (2013.01); *H01L 2933/005* (2013.01); *H01L 2933/0041* (2013.01)

(58) Field of Classification Search
CPC ..... H01L 33/50; H01L 33/502; H01L 33/504; H01L 33/54; H01L 33/56; H01L 2933/0041; H01L 2933/005; H01L 2251/5376
See application file for complete search history.

(56) References Cited

U.S. PATENT DOCUMENTS

| | | |
|---|---|---|
| 9,109,762 B2 | 8/2015 | Yamakawa et al. |
| 9,112,120 B2 | 8/2015 | Yamakawa et al. |
| 2013/0307011 A1 | 11/2013 | Yamakawa et al. |
| 2014/0036499 A1 | 2/2014 | Yamakawa et al. |
| 2016/0316527 A1* | 10/2016 | Allen ............... H05B 33/086 |

FOREIGN PATENT DOCUMENTS

| | | |
|---|---|---|
| WO | WO 2012/108065 A1 | 8/2012 |
| WO | WO 2012/144087 A1 | 10/2012 |

\* cited by examiner

*Primary Examiner* — Thanhha Pham
(74) *Attorney, Agent, or Firm* — McGinn IP Law Group, PLLC (57) ABSTRACT

A light-emitting device includes a first light-emitting element, a phosphor, and a second light-emitting element having a peak wavelength between peak wavelengths of two peaks that define a deepest dip in a composite emission spectrum of the first light-emitting element and the phosphor.

7 Claims, 7 Drawing Sheets

LIGHT-EMITTING DEVICE

The present application is based on Japanese patent applications No. 2016-034878 ad 2016-064427 filed on Feb. 25, 2016 and Mar. 28, 2016, respectively, the entire contents of which are incorporated herein by reference.

BACKGROUND OF THE INVENTION

1. Field of the Invention

The invention relates to a light-emitting device.

2. Description of the Related Art

A light-emitting device is known which is provided with an LED (Light-Emitting Diode) and a phosphor to emit a white light (see e.g., WO 2012/108065 and WO 2012/144087). The light-emitting device has a spectrum of white light formed from a composite emission spectrum of the LED and the phosphor.

SUMMARY OF THE INVENTION

The phosphor, however, has such properties that a wavelength region of an absorption spectrum is far from that of an emission spectrum. Therefore, to increase excitation light absorption efficiency, a light-emitting element used as an excitation source needs to have an emission wavelength far from the emission spectrum of the phosphor.

This causes a deep recess (dip) between the emission wavelength of the light-emitting element and that of the phosphor in a composite emission spectrum of the light-emitting element and the phosphor, especially in a bluish-white spectrum with a high color temperature such as daylight color. The deep dip prevents the light-emitting device from having an emission spectrum closer to a spectrum of sunlight (natural light).

It is an object of the invention to provide a light-emitting device that has an emission spectrum that includes only a shallow dip and comes close to that of the sunlight.

An embodiment of the invention provides a light-emitting device defined by [1] to [7] below.

[1] A light-emitting device, comprising:
a first light-emitting element;
a phosphor; and
a second light-emitting element having a peak wavelength between peak wavelengths of two peaks that define a deepest dip in a composite emission spectrum of the first light-emitting element and the phosphor.

[2] The light-emitting device according to [1], wherein the peak wavelength of the second light-emitting element is shifted within 2 nm from a wavelength at a bottom of the deepest dip.

[3] The light-emitting device according to [1], wherein the second light-emitting element comprises a plurality of light-emitting lights that are different in emission wavelength.

[4] The light-emitting device according to any one of [1] to [3], further comprising:
a first sealing material that seals the first light-emitting element; and
a second sealing material that seals the second light-emitting element,
wherein the phosphor is included in the first sealing material.

[5] The light-emitting device according to any one of [1] to [4], wherein the first sealing material is in contact with the second sealing material, and
wherein the first sealing material has a lower refractive index than the second sealing material.

[6] The light-emitting device according to any one of [1] to [5], wherein the first sealing material is in contact with the second sealing material, and
wherein one of the first and second sealing materials comprises an annular sealing material having an annular shape in a plan view, and
wherein an other thereof is surrounded by the annular sealing material.

[7] The light-emitting device according to any one of [1] to [6], wherein the second light-emitting element is configured to function as a transmitter for an optical communication.

Effects of the Invention

According to an embodiment of the invention, a light-emitting device can be provided that has an emission spectrum that includes only a shallow dip and comes close to that of the sunlight.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

Embodiment

Configuration of Light-Emitting Device

Figure 1A:
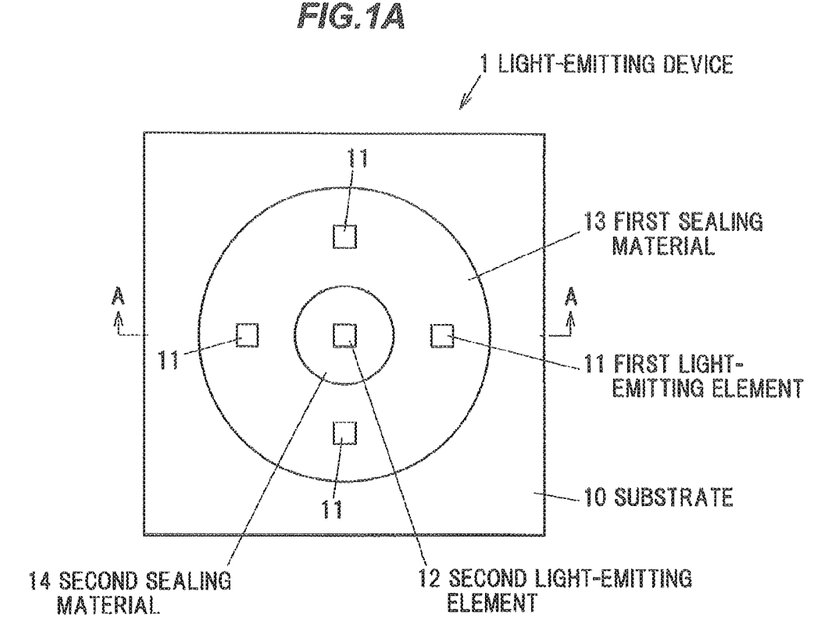
FIG. 1A is a top view showing a light-emitting device in an embodiment.
Figure 1B:
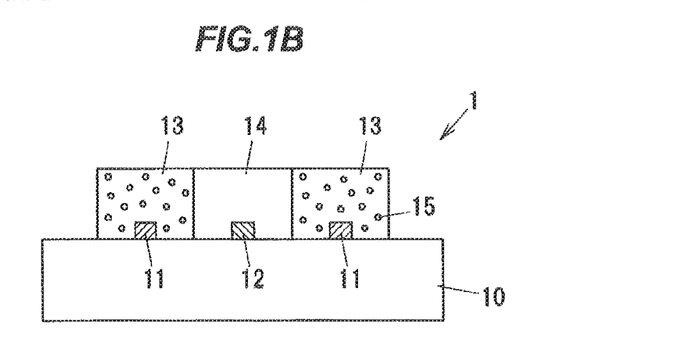
FIG. 1B is a vertical cross-sectional view showing the light-emitting device taken along a line A-A in FIG. 1A.

FIG. 1A is a top view showing a light-emitting device 1 in an embodiment. FIG. 1B is a vertical cross-sectional view showing the light-emitting device 1 taken along the line A-A in FIG. 1A.

The light-emitting device 1 has a substrate 10, first light-emitting elements 11 and a second light-emitting element 12 which are mounted on the substrate 10, a first sealing material 13 for sealing the first light-emitting elements 11, a second sealing material 14 for sealing the second light-emitting element 12, and a particulate phosphor 15 contained in the first sealing material 13.

The first light-emitting element 11 functions as a source of light for exciting the phosphor 15, and a white color is produced by mixing an emission color of the first light-emitting element 11 with an emission color of the phosphor 15. The phosphor 15 may alternatively be composed of plural types of phosphors having different wavelengths. In this case, the configuration may be such that a light-emitting element emitting ultraviolet light is used as the first light-emitting element 11 and white color is produced by mixing emission colors of the plural phosphors.

The second light-emitting element 12 is used to compensate for the deepest dip in a composite emission spectrum of the first light-emitting elements 11 and the phosphor 15 so that the light-emitting device 1 has an emission spectrum closer to sunlight.

For this reason, the second light-emitting element 12 has a peak wavelength between two peak wavelengths (wavelengths at the maximum points of two peaks) which form the deepest dip in the composite emission spectrum of the first light-emitting elements 11 and the phosphor 15. In addition, a shift of the peak wavelength of the second light-emitting element 12 is preferably within 2 nm from the wavelength at the bottom of the deepest dip.

Plural second light-emitting elements 12 emitting light of different wavelengths may be provided. In this case, all of the second light-emitting elements 12 have peak wavelengths between the two peak wavelengths which form the deepest dip.

Figure 2A:
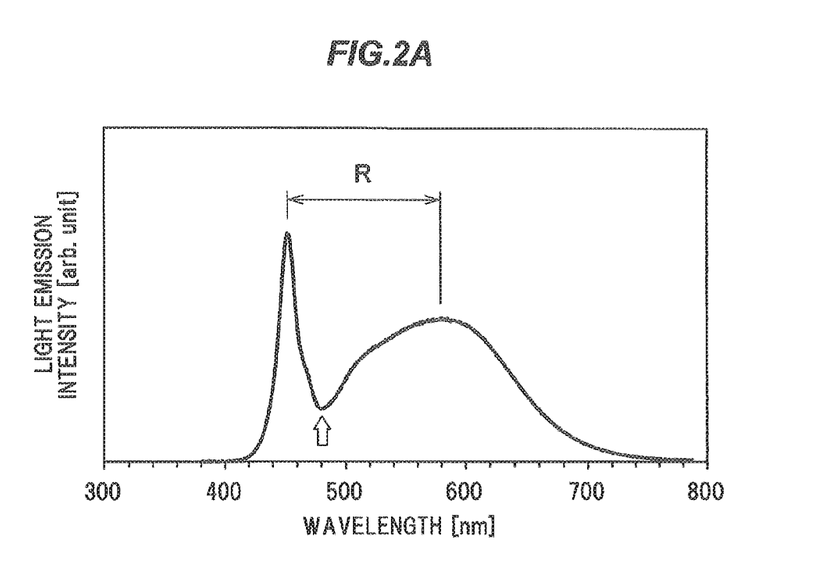
FIGS. 2A and 2B are diagrams showing examples of a composite emission spectrum of a light-emitting element and a phosphor.
Figure 2B:
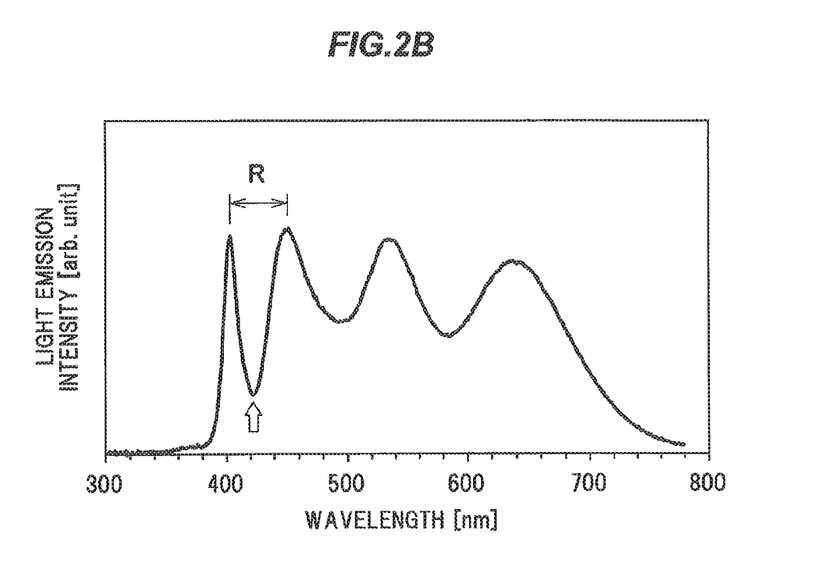

FIGS. 2A and 2B are diagrams showing examples of a composite emission spectrum of the light-emitting elements 11 and the phosphor 15.

FIG. 2A shows a composite emission spectrum when the first light-emitting element 11 is a blue LED having an emission wavelength of 450 nm and the phosphor 15 is composed of $Lu_3Al_5O_{12}:Ce^{3+}$ (green phosphor), $Y_3Al_4O_{13}:Ce^{3+}$ (yellow phosphor) and $CaAlSiN_3:Eu^{2+}$ (red phosphor).

In the composite emission spectrum of the first light-emitting elements 11 and the phosphor 15 shown in FIG. 2A, the wavelength at the bottom of the deepest dip (pointed by an arrow) is about 481 nm. Meanwhile, the wavelengths of the two peaks forming the deepest dip are about 452 nm on the short wavelength side (a peak of the emission spectrum of the first light-emitting elements 11) and about 577 nm on the long wavelength side (a peak of the emission spectrum of the phosphor 15).

The second light-emitting element 12 used in this case is preferably a light-emitting element of which peak wavelength is in a range R of more than 452 nm and less than 577 nm and is shifted within 2 nm from 481 nm, i.e., is not less than 479 nm and not more than 483 nm. In addition, when using plural second light-emitting elements 12 having different emission wavelengths, all of the light-emitting elements have peak wavelengths within the range R.

FIG. 2B shows a composite emission spectrum when the first light-emitting element 11 is a purple LED having an emission wavelength of 405 nm and the phosphor 15 is composed of $(Sr,Ca,Ba)_{10}(PO_4)Cl_2:Eu^{2+}$ (blue phosphor), $(Sr,Al)_6(O,N)_8:Eu^{2+}$ (green phosphor) and $CaAlSiN_3:Eu^{2+}$ (red phosphor).

In the composite emission spectrum of the first light-emitting elements 11 and the phosphor 15 shown in FIG. 2B, the wavelength at the bottom of the deepest dip (pointed by an arrow) is about 422 nm. Meanwhile, the wavelengths of the two peaks forming the deepest dip are about 402 nm on the short wavelength side (a peak of the emission spectrum of the first light-emitting elements 11) and about 454 nm on the long wavelength side (a peak of the emission spectrum of the phosphor 15).

The second light-emitting element 12 used in this case is preferably a light-emitting element of which peak wavelength is in a range R of more than 402 nm and less than 454 nm and is shifted within 2 nm from 422 nm, i.e., is not less than 420 nm and not more than 424 nm. In addition, when using plural second light-emitting elements 12 having different emission wavelengths, all of the light-emitting elements have peak wavelengths within the range R.

The phosphor 15 may be contained in both the first sealing material 13 and the second sealing material 14. However, when the phosphor 15 is contained in the second sealing material 14, light emitted from the second light-emitting element 12 is more absorbed by the phosphor 15 and it is thus difficult to determine an emission wavelength and light emission intensity of the second light-emitting element 12 required to compensate for the deepest dip. Therefore, it is preferable that the phosphor 15 be contained only in the first sealing material 13.

In case that the first sealing material 13 is in contact with the second sealing material 14, the first sealing material 13 preferably has a lower refractive index than the second sealing material 14. In this case, light is less likely to pass from the second sealing material 14 to the first sealing material 13. Therefore, the light emitted from the second light-emitting element 12 is less absorbed by the phosphor 15 contained in the first sealing material 13.

The substrate 10 is, e.g., a circuit board or a lead frame insert substrate.

The first light-emitting element 11 and the second light-emitting element 12 are, e.g., LED chips which have a chip substrate and a crystal layer which includes a light-emitting layer and cladding layers sandwiching the light-emitting layer. The first light-emitting element 11 and the second light-emitting element 12 may be either a face-up LED chip with the crystal layer facing upward or a face-down LED chip with the crystal layer facing downward. Alternatively, the first light-emitting element 11 and the second light-emitting element 12 may be light-emitting elements other than LED chips and may be laser diodes, etc.

The first light-emitting elements 11 and the second light-emitting element 12 are connected to a conductive member (not shown) such as wiring or lead frame in the substrate 10 and are respectively independently powered through the conductive member.

The first sealing material 13 and the second sealing material 14 are formed of, e.g., a transparent resin such as silicone-based resin or epoxy-based resin.

Since the first light-emitting elements 11 and the second light-emitting element 12 are independently powered, respective light emission intensities can be arbitrarily adjusted. This allows the light-emitting device 1 to have an emission spectrum closer to sunlight.

The numbers and layout, etc., of the first light-emitting elements 11 and the second light-emitting elements 12 and the numbers, shape and layout, etc., of the first sealing materials 13 and the second sealing materials 14 are not specifically limited.

In the configuration example of the light-emitting device in the present embodiment shown in FIGS. 1A and 1B, the first sealing material 13 is an annular sealing material having an annular shape in a plan view, and the second sealing material 14 is surrounded by the annular first sealing material 13.

Figure 3A:
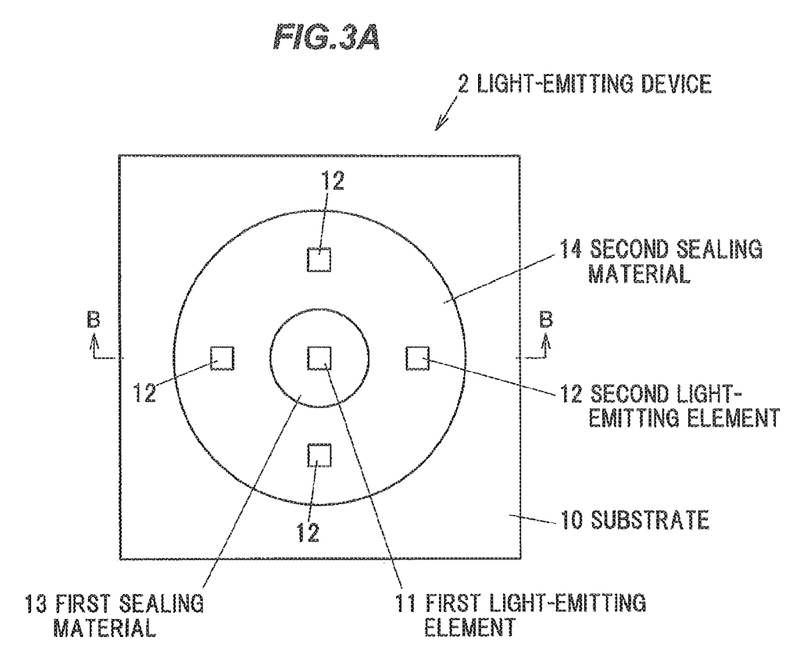
FIG. 3A is a top view showing a modification of the light-emitting device in the embodiment.
Figure 3B:
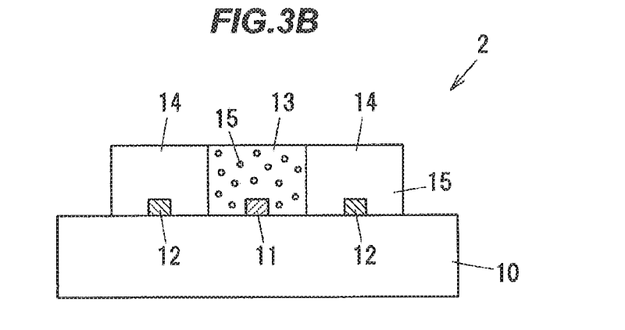
FIG. 3B is a vertical cross-sectional view showing the light-emitting device taken along a line B-B in FIG. 3A.

FIG. 3A is a top view of a light-emitting device 2 having a configuration which is based on the light-emitting device 1 shown in FIGS. 1A and 1B but the first light-emitting element 11 and the second light-emitting element 12 are positioned the other way round, and the first sealing material 13 and the second sealing material 14 are also positioned the other way round. FIG. 3B is a vertical cross-sectional view showing the light-emitting device 2 taken along the line B-B in FIG. 3A.

In the configuration example of the light-emitting device in the present embodiment shown in FIGS. 3A and 3B, the second sealing material 14 is an annular sealing material having an annular shape in a plan view, and the first sealing material 13 is surrounded by the annular second sealing material 14. Alternatively, the configuration shown in FIGS. 3A and 3B may additionally include an annular sealing material which is formed of the same material as the first sealing material 13, is provided to seal the first light-emitting element(s) 11 and surrounds the annular second sealing material 14. In addition, an annular sealing material formed of the same material as the second sealing material 14 and provided to seal the second light-emitting elements 12 may be further formed so as to surround the annular sealing material sealing the first light-emitting element(s) 11. The number of the annular sealing materials alternately provided to seal the first light-emitting elements 11 and the second light-emitting elements 12 is not limited.

When, for example, plural the second light-emitting elements 12 having different wavelengths are provided, the configuration using plural the second light-emitting elements 12, such as the configuration of the light-emitting device 2, is adapted.

Process of Manufacturing the Light-Emitting Device

A process of manufacturing the light-emitting device 1 will be described below as an example.

Figure 4A:
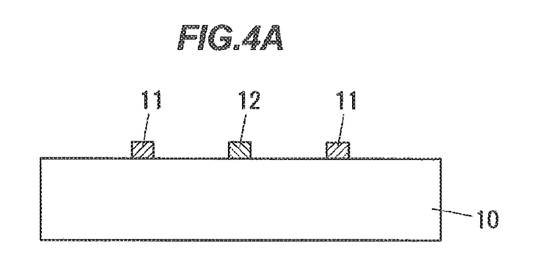
FIGS. 4A to 4C are vertical cross-sectional views showing a process of manufacturing the light-emitting device in the embodiment.
Figure 4B:
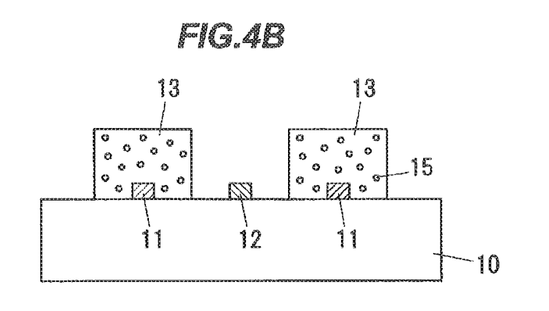
Figure 4C:
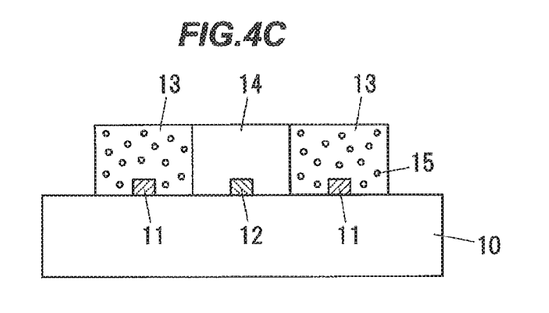

FIGS. 4A to 4C are vertical cross-sectional views showing a process of manufacturing the light-emitting device 1 in the embodiment.

Firstly, as shown in FIG. 4A, the first light-emitting elements 11 and the second light-emitting element 12 are mounted on the substrate 10.

Figure 5:
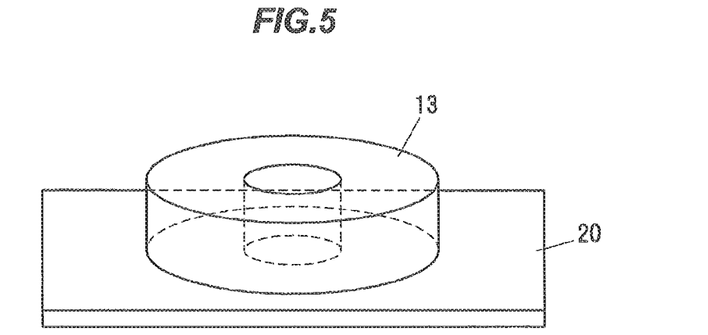
FIG. 5 is a perspective view showing a first sealing material before adhesion in case that the first sealing material is patterned and then adhered to a substrate.

Next, as shown in FIG. 4B, the first light-emitting elements 11 are sealed with the first sealing material 13 containing the phosphor 15. The first sealing material 13 is pre-patterned and then adhered to the substrate 10, or the first sealing material 13 is formed by a potting process FIG. 5 is a perspective view showing the first sealing material 13 before adhesion in case that the first sealing material 13 is patterned and then adhered to the substrate 10. The first sealing material 13 is patterned on a sheet-shaped base material 20 formed of PET, etc.

Next, as shown in FIG. 4C, a region surrounded by the first sealing material 13 is filled with a resin by a potting process, thereby forming the second sealing material 14.

FIGS. 6A to 6D are vertical cross-sectional views showing a modification of the process of manufacturing the light-emitting device 1 in the embodiment. This modification is different from the manufacturing process shown in FIGS. 4A to 4C in that the first sealing material 13 and the second sealing material 14 are formed in the reverse order.

Figure 6A:
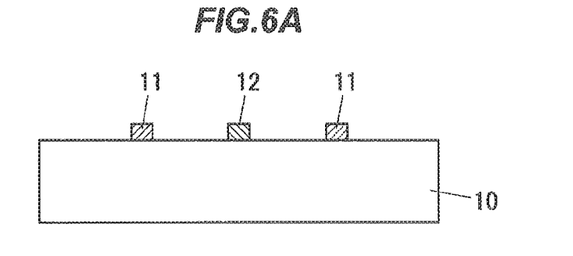
FIGS. 6A to 6D are vertical cross-sectional views showing a modification of the process of manufacturing the light-emitting device in the embodiment.

Firstly, as shown in FIG. 6A, the first light-emitting elements 11 and the second light-emitting element 12 are mounted on the substrate 10.

Figure 6B:
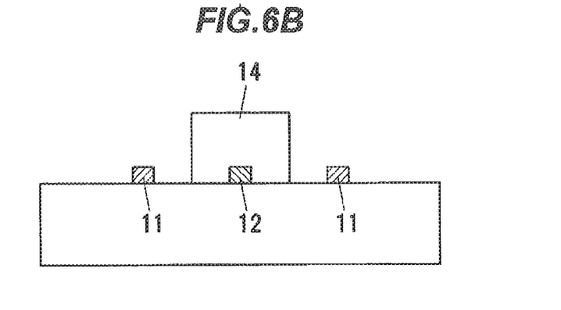

Next, as shown in FIG. 6B, the light-emitting element 12 is sealed with the second sealing material 14. The second sealing material 14 is pre-patterned and then adhered to the substrate 10, or the second sealing material 14 is formed by a potting process.

Figure 6C:
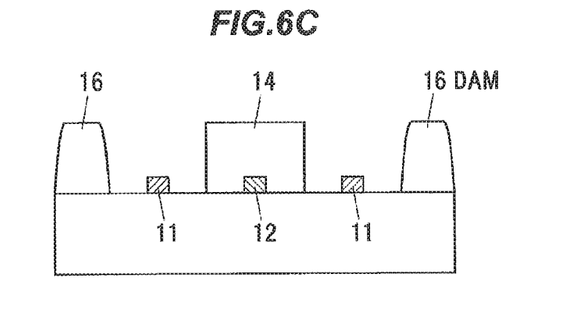

Next, as shown in FIG. 6C, an annular dam 16 is formed so as to surround a region for mounting the first light-emitting elements 11. The dam 16 is formed of, e.g., a resin such as silicone-based resin or epoxy-based resin and may contain white pigment such as titanium oxide.

Figure 6D:
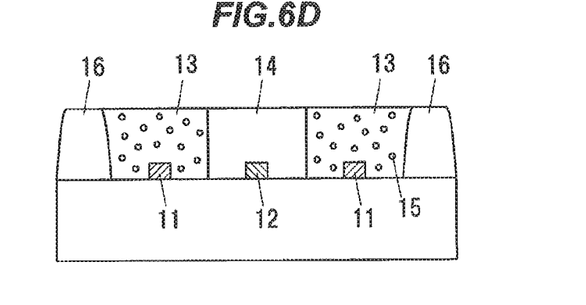

Next, as shown in FIG. 6D, a region between the dam 16 and the second sealing material 14 is filled with a resin containing the phosphor 15 by a potting process, thereby forming the first sealing material 13. Although the dam 16 may not be formed, the shape of the first sealing material 13 formed by a potting process can be easily controlled when the dam 16 is formed.

When manufacturing the light-emitting device 2, the process shown in FIGS. 4A to 4C or FIGS. 6A to 6D is performed so that the first light-emitting element 11 and the second light-emitting element 12 are positioned the other way round, and the first sealing material 13 and the second sealing material 14 are formed in the reverse order.

Modification of the Light-Emitting Device

Next, the light-emitting device 1 used as an optical transmitter of an optical communication system will be described as an example.

The second light-emitting element 12 can be used as a transmitter for optical communication. A signal modulated at high speed for communication is sent to the second light-emitting element 12 from, e.g., a control unit outside the light-emitting device 1 and the light-emitting element 12 emits light based on the signal to perform communication. In this case, the light-emitting device 1 functions as a lighting device as well as an optical transmitter of a transceiver system.

A photodetector (receiver) in this optical communication is, e.g., a Si photodiode or an image sensor such as camera mounted as standard on smartphone. In a specific example, the light-emitting device 1 is, e.g., a downlight used in store and sends product information to smartphones of customers through communication using the second light-emitting element 12.

When the emission wavelength of the first light-emitting element 11, i.e., the wavelength for exciting the phosphor 15, is a wavelength in the violet or ultraviolet region, the emission wavelength of the second light-emitting element 12 is in a low visibility region of around 420 nm as shown in FIG. 2B. Therefore, a change in light emission intensity, if occurred due to use of the second light-emitting element 12, does not have an impact such as causing flickering in vision, and a communication optical signal can be multiplexed while reducing an impact on the lighting function.

Figure 7A:
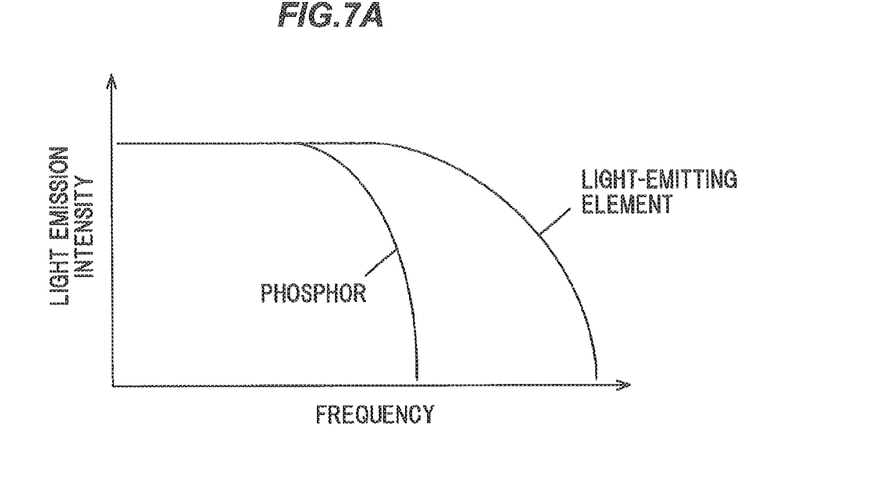
FIG. 7A is a graph illustrating a difference in response to frequency of electrical signal between the light-emitting element and the phosphor.

FIG. 7A is a graph illustrating a difference in response to frequency of electrical signal between the light-emitting element (LED chip) and the phosphor. As shown in FIG. 7A, the threshold frequency at which the phosphor to be excited by light emitted from the light-emitting element can respond to an electrical signal is lower than the threshold frequency at which the light-emitting element can respond to an electrical signal. In other words, the phosphor has a lower cutoff frequency than the light-emitting element. This indicates that the phosphor has a slower response speed than the light-emitting element and is thus not suitable for communication.

Figure 7B:
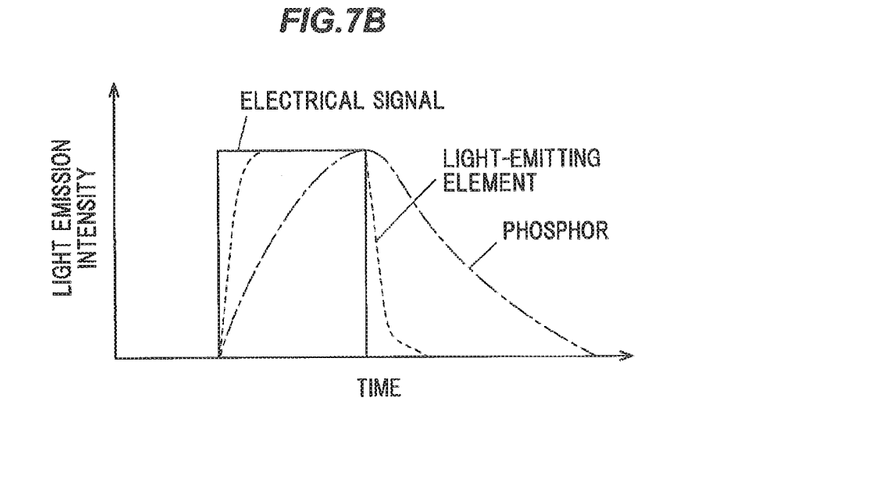
FIG. 7B is a graph illustrating a difference in response speed between the light-emitting element and the phosphor.

FIG. 7B is a graph illustrating a difference in response speed between the light-emitting element (LED chip) and the phosphor. Unlike the waveform of the light-emitting element, the waveform of the phosphor greatly collapses from the waveform of the electrical signal as shown in FIG. 7B and becomes noise in an optical signal. Therefore, the phosphor is not suitable for communication.

For such reasons, communication accuracy decreases when fluorescence of the phosphor is mixed with communication light emitted from the second light-emitting element 12. Therefore, the second light-emitting element 12 used for communication is preferably sealed with the second sealing material 14 not containing the phosphor 15.

Effects of the Embodiment

In the embodiment, it is possible to provide the light-emitting device 1 having an emission spectrum close to sunlight by using the second light-emitting element 12 to compensate for the deepest dip in the composite emission spectrum of the first light-emitting elements 11 and the phosphor 15. In addition, the second light-emitting element 12 can be used also as a transmitter for optical communication.

Although the embodiment of the invention has been described, the invention is not intended to be limited to the embodiment and the various kinds of modifications can be implemented without departing from the gist of the invention. In addition, the constituent elements in the embodiment can be arbitrarily combined without departing from the gist of the invention.

The embodiment is applicable even when the deepest dip in the composite emission spectrum of the first light-emitting elements 11 and the phosphor 15 is formed between, e.g., two peaks of the phosphor 15, i.e., even when a dip other than the dip on the shortest wavelength side is the deepest. Even in such a case, a light-emitting device having an emission wavelength capable of compensating the deepest dip is used as the second light-emitting element 12.

In addition, the invention according to claims is not to be limited to the embodiment. Further, please note that all combinations of the features described in the embodiment are not necessary to solve the problem of the invention.

What is claimed is:

1. A light-emitting device, comprising:
   a first light-emitting element;
   a phosphor; and
   a second light-emitting element having a peak wavelength between peak wavelengths of two peaks that define a deepest dip in a composite emission spectrum of the first light-emitting element and the phosphor.

2. The light-emitting device according to claim 1, wherein the peak wavelength of the second light-emitting element is shifted within 2 nm from a wavelength at a bottom of the deepest dip.

3. The light-emitting device according to claim 1, wherein the second light-emitting element comprises a plurality of light-emitting lights that are different in emission wavelength.

4. The light-emitting device according to claim 1, further comprising:
   a first sealing material that seals the first light-emitting element; and
   a second sealing material that seals the second light-emitting element,
   wherein the phosphor is included in the first sealing material.

5. The light-emitting device according to claim 1, wherein the first sealing material is in contact with the second sealing material, and
   wherein the first sealing material has a lower refractive index than the second sealing material.

6. The light-emitting device according to claim 1, wherein the first sealing material is in contact with the second sealing material, and
   wherein one of the first and second sealing materials comprises an annular sealing material having an annular shape in a plan view, and
   wherein an other thereof is surrounded by the annular sealing material.

7. The light-emitting device according to claim 1, wherein the second light-emitting element is configured to function as a transmitter for an optical communication.

* * * * *